United States Patent
Ryu

(10) Patent No.: US 7,205,242 B2
(45) Date of Patent: Apr. 17, 2007

(54) METHOD FOR FORMING ISOLATION LAYER IN SEMICONDUCTOR DEVICE

(75) Inventor: Choon Kun Ryu, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 168 days.

(21) Appl. No.: 10/880,278

(22) Filed: Jun. 29, 2004

(65) Prior Publication Data

US 2005/0227495 A1 Oct. 13, 2005

(30) Foreign Application Priority Data

Apr. 8, 2004 (KR) .................... 10-2004-0024186

(51) Int. Cl.
*H01L 21/302* (2006.01)
*H01L 21/461* (2006.01)

(52) U.S. Cl. .................. 438/706; 438/702; 257/E21.54

(58) Field of Classification Search ................ 438/706, 438/702, 703; 257/E21.54, E21.545, E21.553
See application file for complete search history.

(56) References Cited

U.S. PATENT DOCUMENTS 5,968,279 A * 10/1999 MacLeish et al. ........... 134/1.2
6,034,409 A * 3/2000 Sakai et al. .................. 257/506
6,194,283 B1 * 2/2001 Gardner et al. ............. 438/424
6,207,532 B1 * 3/2001 Lin et al. ..................... 438/424
6,524,930 B1 * 2/2003 Wasshuber et al. ......... 438/424
6,921,721 B2 * 7/2005 Kirkpatrick et al. ........ 438/706
2002/0162571 A1 * 11/2002 Su et al. ......................... 134/2
2004/0147090 A1 * 7/2004 Kim et al. ................... 438/424
2004/0251236 A1 * 12/2004 Zhang et al. ................. 216/67

* cited by examiner

Primary Examiner—Caridad Everhart
(74) Attorney, Agent, or Firm—Marshall, Gerstein & Borun LLP

(57) ABSTRACT

The present invention relates to a method for forming an insulating layer in a semiconductor device. After a first oxide film is formed in a trench, an impurity remaining on the first oxide film in the process of etching the first oxide film using a gas containing fluorine is stripped using oxygen plasma or hydrogen plasma. Thus, it can prevent degradation of device properties due to diffusion of the impurity without additional equipment. Therefore, it can help improve reliability of a next-generation device.

18 Claims, 6 Drawing Sheets

METHOD FOR FORMING ISOLATION LAYER IN SEMICONDUCTOR DEVICE

BACKGROUND

1. Field of the Invention

The present invention relates to a method for forming an insulating layer in a semiconductor device, and more specifically, to a method for forming an insulating layer in an NAND flash memory device wherein the insulating layer is formed by means of a STI (shallow trench isolation) process.

2. Discussion of Related Art

As a minimum line width in a next-generation high-integration semiconductor device becomes narrow, the distance of a trench type insulating layer for isolation is narrowed. If a trench is filled with an oxide film, preferably a high-density plasma oxide film by means of an existing single process, voids 10 are generated in the insulating layer, as shown in FIG. 1. In order to solve this problem, the trench is filled in such a manner that a first oxide film 21 is formed, a blanket etch is performed and a second oxide film 22 is then formed, as shown in FIG. 2. However, in the etch process of the first oxide film 21, impurities remain on the first oxide film 21 and are diffused into the device in a subsequent process. This causes the device to degrade.

A case where this insulating layer formation process is applied to a process of fabricating an NAND type flash memory device will now be described in short with reference to FIG. 3A and FIG. 3B.

Referring to FIG. 3A, a tunnel oxide film 32, a polysilicon film 33 and a nitride film 34 are sequentially formed on a semiconductor substrate 31. The tunnel oxide film 32, the polysilicon film 33 and the nitride film 34 are then patterned by means of a lithography process and an etch process using an isolation mask, thus exposing a given region of the semiconductor substrate 31. The exposed semiconductor substrate 31 is then etch to a predetermined depth to form a trench. After a sidewall oxide film is formed in the trench, a first oxide film 35 is formed to fill the trench. Next, the first oxide film 35 is etched using a gas containing fluorine (F). In the etch process of the first oxide film 35, however, an impurity by fluorine contained in the etch gas, for example, a fluorosilicate glass (FSG) film 36 is generated on the first oxide film 35.

By reference to FIG. 3B, a second oxide film 37 is formed on the entire structure and is then subjected to a blanket etch to form an insulating layer.

However, as the insulating layer formed by the above process is subjected to a subsequent annealing process, fluorine of the FSG film 36 formed on the first oxide film 35 is diffused into the device. This can degrade the characteristics of the device.

SUMMARY OF THE INVENTION

Accordingly, the present invention has been made in view of the above problems, and it is an object of the present invention to provide a method for forming an insulating layer in a semiconductor device wherein a FSG film generated when a first oxide film is etched is removed by means of an etch process using oxygen, whereby diffusion of fluorine is prevented to prevent characteristics of the device from degrading.

Another object of the present invention is to provide a method for forming an insulating layer in a semiconductor device wherein a FSG film generated when a first oxide film is etched is removed by means of an etch process using hydrogen, whereby diffusion of fluorine is prevented to prevent characteristics of the device from degrading.

According to a preferred embodiment of the present invention, there is provided a method for forming an insulating layer to a semiconductor device, comprising the steps of: etching a semiconductor substrate to a predetermined depth to form a trench, forming a sidewall oxide film in the trench by means of an oxidization process and then forming a first oxide film on the entire structure, performing a blanket etch for the first oxide film, wherein an impurity remains on the first oxide film, stripping the impurity by means of an etch process, and forming a second oxide film on the entire structure and then performing a blanket etch process to form an insulating layer.

The blanket etch process of the first oxide film is performed so that the top surface of the first oxide film is located higher than the interface of a tunnel oxide film and a polysilicon film.

The blanket etch process of the first oxide film is performed using a mixed gas of $NF_3$ and He.

The $NF_3$ gas of 50 to 200 sccm is used and the He gas of 200 to 500 sccm is used.

The blanket etch process of the first oxide film is performed by applying the HF power of about 500 to 1000 W and the LF power of about 3000 to 4000 W.

The impurity stripping process using the oxygen plasma is performed using a mixed gas of oxygen and He.

The oxygen gas of 100 to 1000 sccm is used and the He gas of 200 to 500 sccm is used.

The impurity stripping process using the oxygen plasma is performed by applying the HF power of 500 to 2000 W and the LF power of 1000 to 8000 W.

The impurity stripping process using the hydrogen plasma is performed using a mixed gas of hydrogen and He.

The oxygen gas of 100 to 1000 sccm is used and the He gas of 200 to 500 sccm is used.

The impurity stripping process using the hydrogen plasma is performed by applying the HF power of 500 to 2000 W and the LF power of 1000 to 8000 W.

DETAILED DESCRIPTION OF PREFERRED EMBODIMENTS

Now the preferred embodiments according to the present invention will be described with reference to the accompanying drawings.

Figure 1:
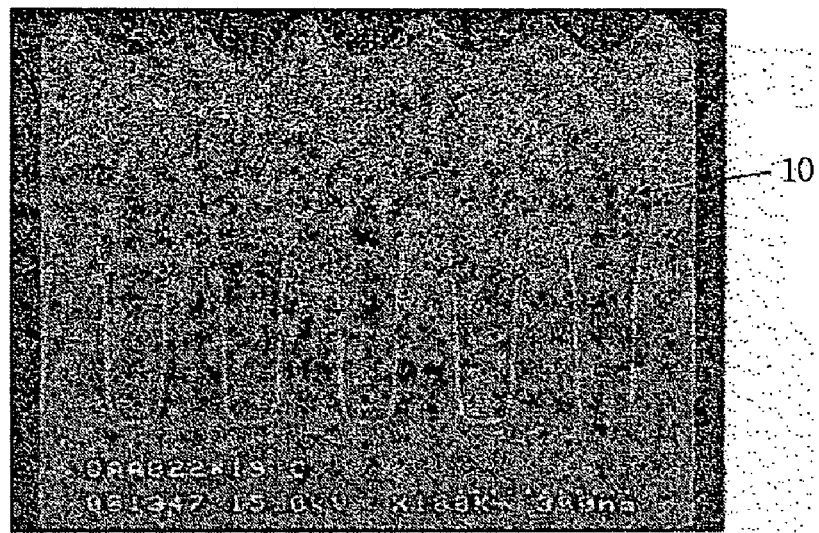
FIG. 1 is a photograph showing voids formed in an insulating layer when a trench is filled with a high-density plasma oxide film to form the insulating layer by a single process.
Figure 2:
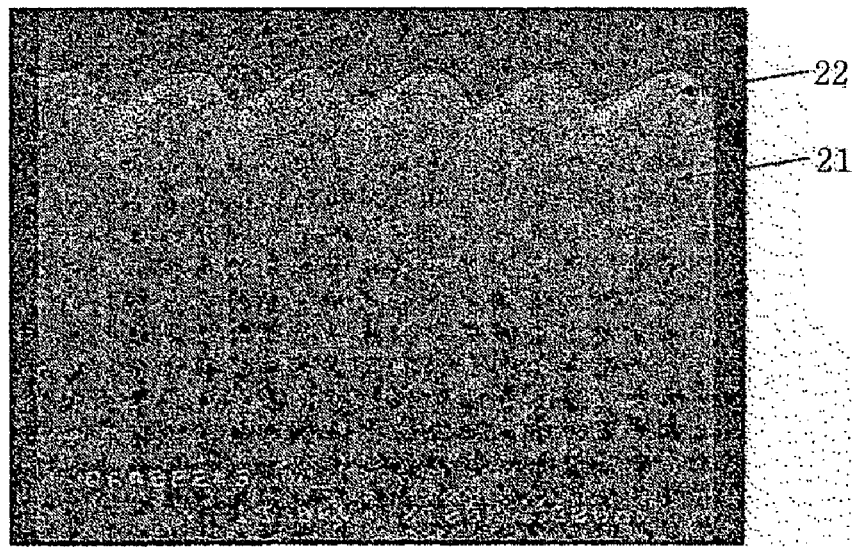
FIG. 2 is a photograph showing a cross-sectional view when an insulating layer is formed in such a way that a first oxide film is formed, a blanket etch is performed and a second oxide film is then formed.
Figure 3A:
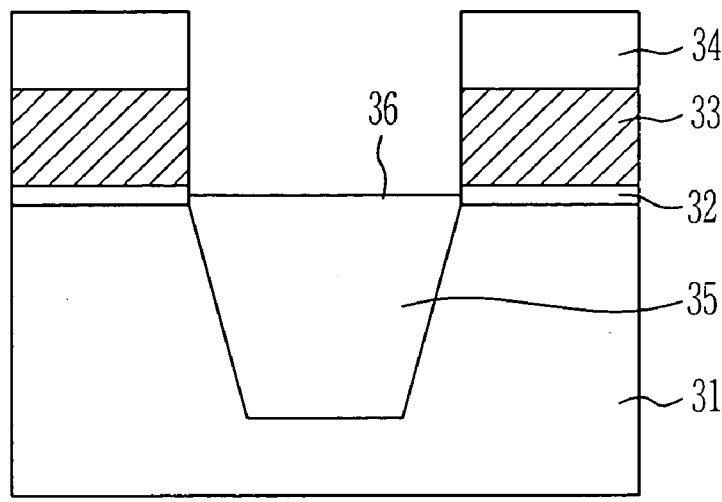
FIG. 3A and FIG. 3B are cross-sectional views shown to explain a conventional method for forming an insulating layer in a semiconductor device.
Figure 3B:
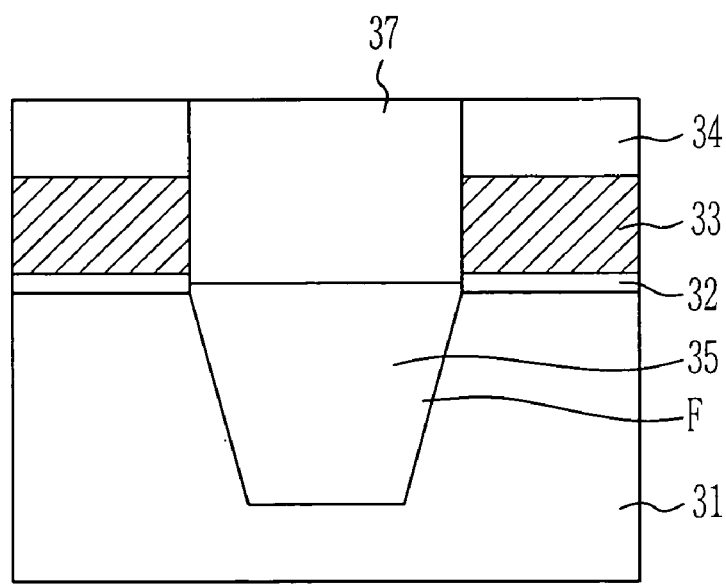
Figure 4A:
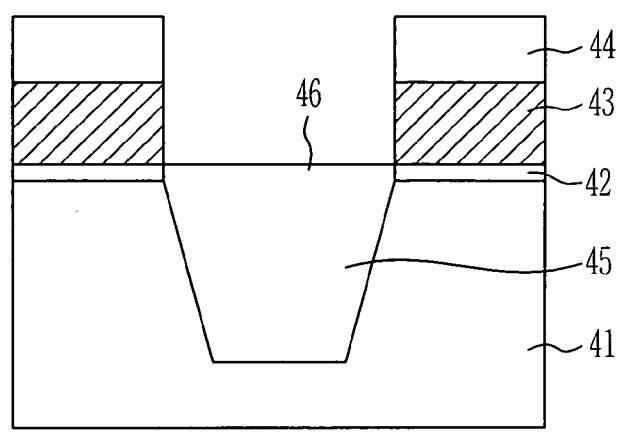
FIG. 4A to FIG. 4C are cross-sectional views shown to explain a method for forming an insulating layer in a semiconductor device according to an embodiment of the present invention.
Figure 4B:
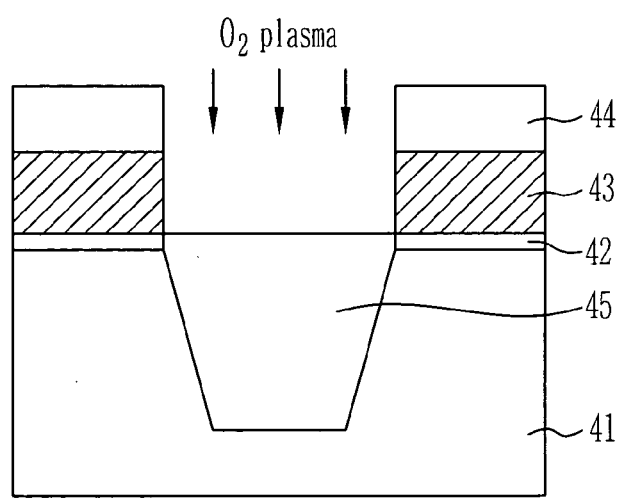
Figure 4C:
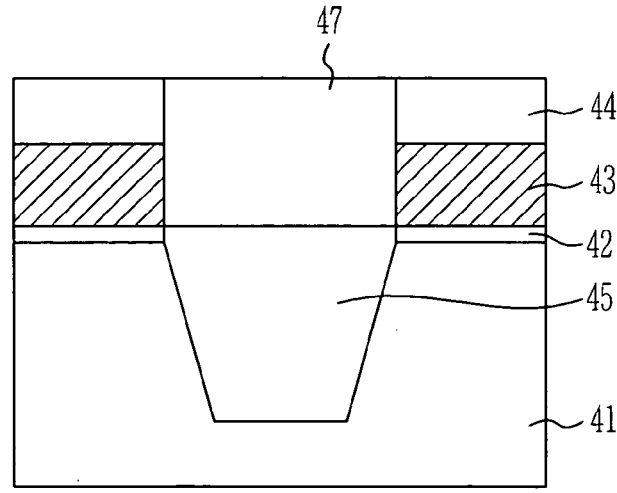

FIG. 4A to FIG. 4C are cross-sectional views shown to explain a method for forming an insulating layer in a semiconductor device according to an embodiment of the present invention. FIG. 4 is a cross-sectional view shown to explain a case where the method is applied to a process of manufacturing a flash memory device.

Referring to FIG. 4A, a tunnel oxide film 42, a polysilicon film 43 and a nitride film 44 are sequentially formed on a semiconductor substrate 41. The tunnel oxide film 42, the polysilicon film 43 and the nitride film 44 are then patterned by means of a lithography process and an etch process using an isolation mask, thus exposing a given region of the semiconductor substrate 41. The exposed semiconductor substrate 41 is etched to a predetermined depth to form a trench. After a sidewall oxide film is formed in the trench, a first oxide film 45, preferably a high-density plasma oxide film is formed to fill the trench. Thereafter, the first oxide film 45 is etched using a gas containing fluorine (F), for example, a mixed gas of $NF_3$ and He. In the above, the etch process of the first oxide film 45 is performed by using a $NF_3$ gas of 50~200 sccm and a He gas of 200~500 sccm and by applying a HF power of 500~1000 W and a LF power of 3000~4000 W. In this case, the etch process of the first oxide film 45 is performed so that the top surface of the first oxide film 45 is located higher than the interface of the tunnel oxide film 42 and the polysilicon film 43, so that plasma charges are prevented from being infiltrated into the tunnel oxide film 42. It can reduce charge damage applied to the tunnel oxide film 42 through the polysilicon film 43. After the etch process is performed, an impurity by fluorine contained in the etch gas, for example, a FSG film 46 is formed on the first oxide film 45.

By reference to FIG. 4B, the FSG film 46 is stripped by means of an etch process using oxygen ($O_2$) plasma. In the above, the stripping process of the FSG film 46 is performed by using an oxygen ($O_2$) gas of 100~1000 sccm and a He gas of 200~500 sccm and applying a HF power of 500~2000 W and a LF power of 1000~8000 W.

Referring to FIG. 4C, a second oxide film 47, preferably a high-density plasma oxide film is formed on the entire structure and is then subjected to a blanket etch to form an insulating layer.

Figure 5A:
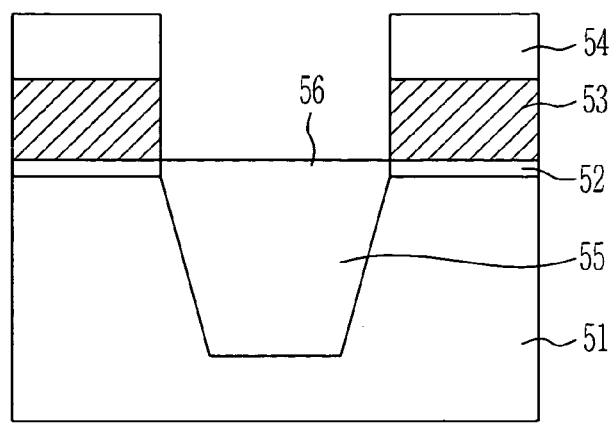
FIG. 5A to FIG. 5C are cross-sectional views shown to explain a method for forming an insulating layer in a semiconductor device according to another embodiment of the present invention.
Figure 5B:
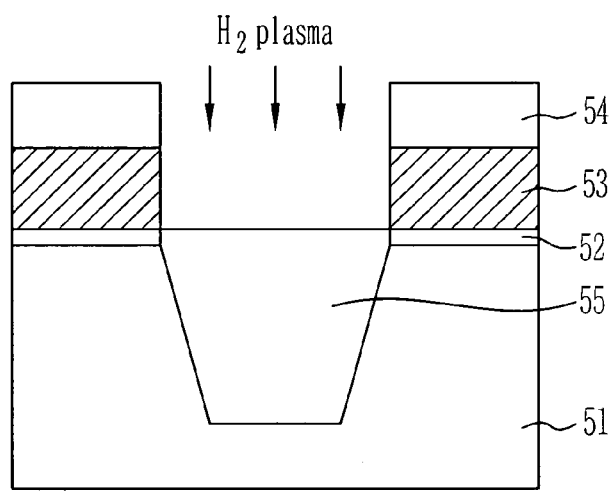
Figure 5C:
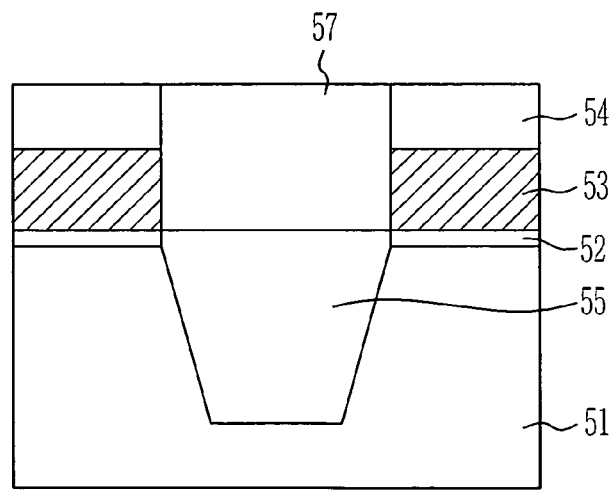

FIG. 5A to FIG. 5C are cross-sectional views shown to explain a method for forming an insulating layer in a semiconductor device according to another embodiment of the present invention.

Referring to FIG. 5A, a tunnel oxide film 52, a polysilicon film 53 and a nitride film 54 are sequentially formed on a semiconductor substrate 51. The tunnel oxide film 52, the polysilicon film 53 and the nitride film 54 are then patterned by means of a lithography process and an etch process using an isolation mask, thus exposing a given region of the semiconductor substrate 51. The exposed semiconductor substrate 51 is etched to a predetermined depth to form a trench. After a sidewall oxide film is formed in the trench, a first oxide film 55, preferably a high-density plasma oxide film is formed to fill the trench. Thereafter, the first oxide film 55 is etched using a gas containing fluorine (F), for example, a mixed gas of $NF_3$ and He. In the above, the etch process of the first oxide film 55 is performed by using a $NF_3$ gas of 50~200 sccm and a He gas of 200~500 sccm and by applying a HF power of 500~1000 W and a LF power of 3000~4000 W. In this case, the etch process of the first oxide film 55 is performed so that the top surface of the first oxide film 55 is located higher than the interface of the tunnel oxide film 52 and the polysilicon film 53, so that plasma charges are prevented from being infiltrated into the tunnel oxide film 52. It can reduce charge damage applied to the tunnel oxide film 52 since the plasma charges through the polysilicon film 53. After the etch process is performed, an impurity by fluorine contained in an etch gas, for example, a FSG film 56 is formed on the first oxide film 55.

By reference to FIG. 5B, the FSG film 56 is stripped by means of an etch process using hydrogen ($H_2$) plasma. In the above, the stripping process of the FSG film 56 is performed by using an hydrogen ($H_2$) gas of 100~1000 sccm and a He gas of 200~500 sccm and applying a HF power of 500~2000 W and a LF power of 1000~8000 W.

Referring to FIG. 5C, a second oxide film 57, preferably a high-density plasma oxide film is formed on the entire structure and is then subjected to a blanket etch to form an insulating layer.

Figure 6A:
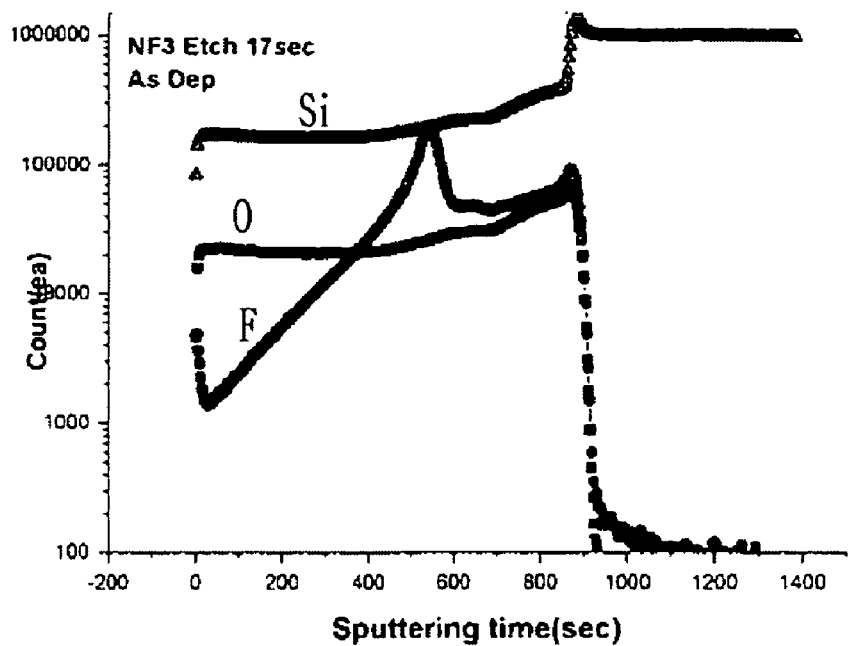
FIG. 6A is a SIMS profile showing distribution of silicon, fluorine and oxygen after deposition of a first oxide film, a blanket etch using $NF_3$ and deposition of a second oxide film in the related art.
Figure 6B:
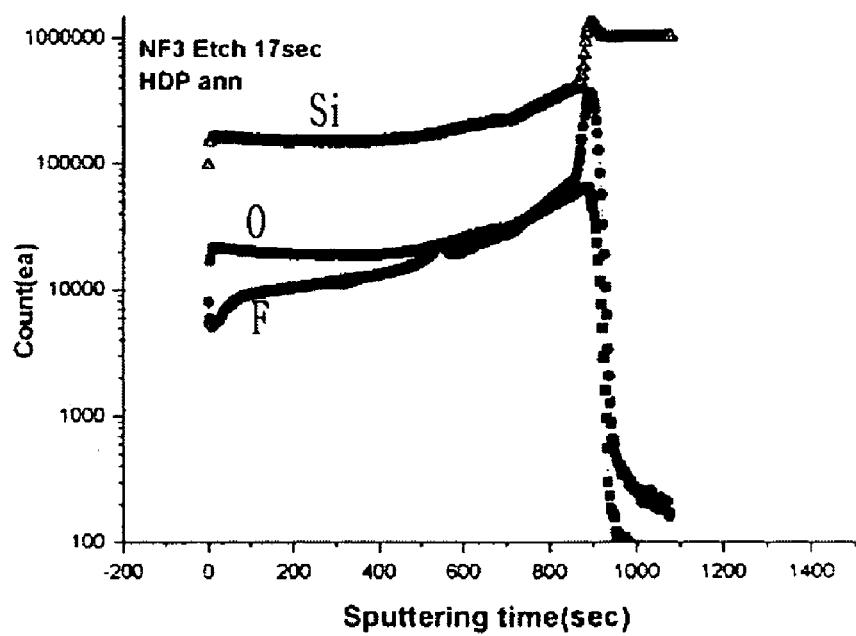
FIG. 6B is a SIMS profile showing that fluorine (F) ions are diffused into the interface of an insulating layer after an annealing process in the related art.
Figure 7A:
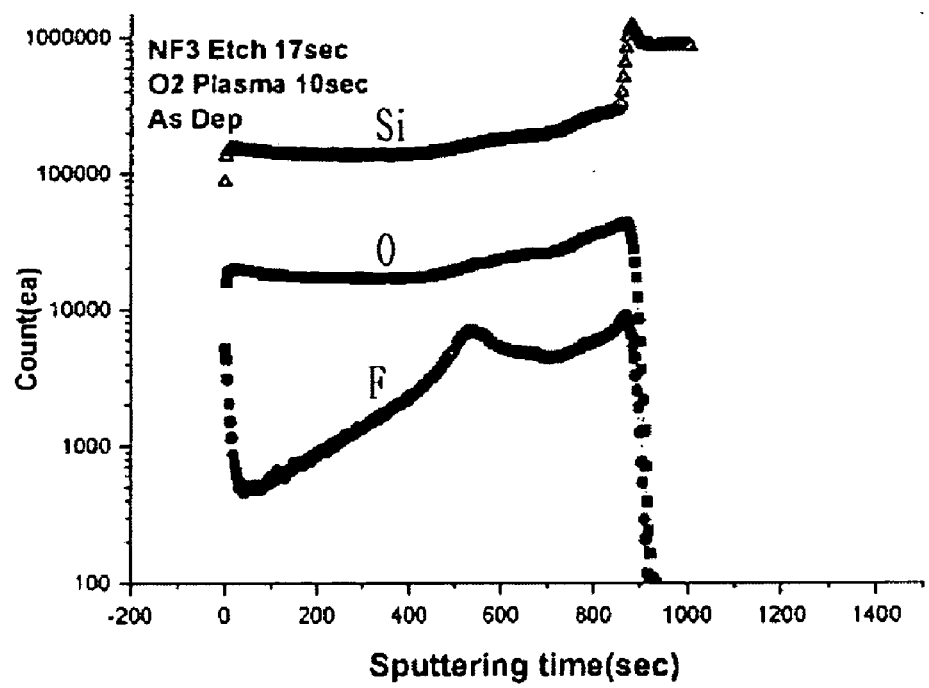
FIG. 7A is a SIMS profile showing distribution of silicon, fluorine and oxygen after deposition of a first oxide film, a blanket etch using $NF_3$ and deposition of a second oxide film according to the present invention.
Figure 7B:
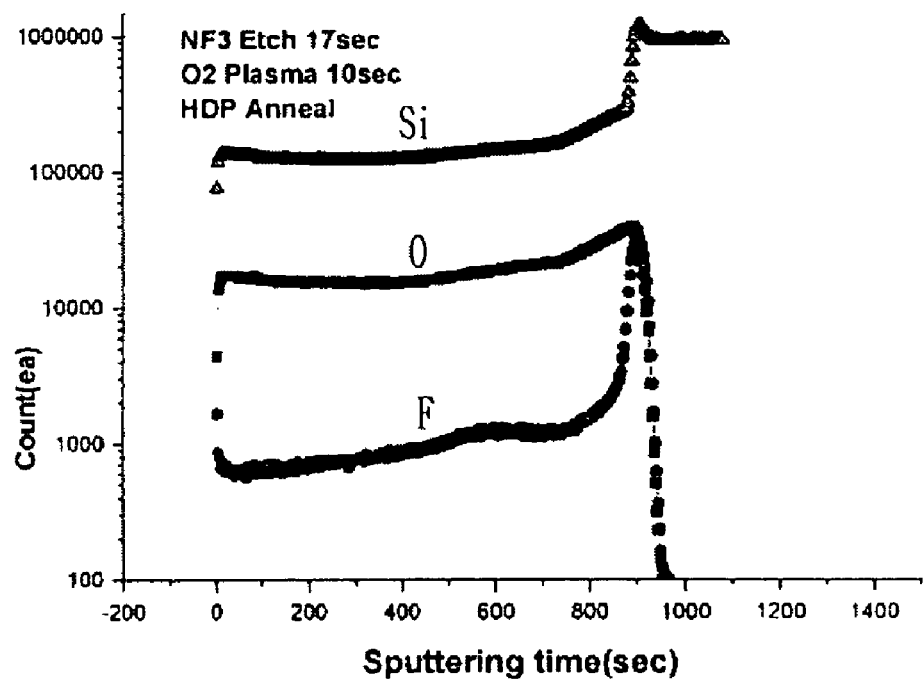
FIG. 7B is a SIMS profile showing that fluorine (F) ions are not diffused into the interface of an insulating layer even after an annealing process according to the present invention.

FIG. 6A is a SIMS profile showing distribution of silicon, fluorine and oxygen after deposition of a first oxide film, a blanket etch using $NF_3$ and deposition of a second oxide film in the related art, and FIG. 6B is a SIMS profile showing that fluorine (F) ions are diffused into the interface of an insulating layer after an annealing process in the related art. Meanwhile, FIG. 7A is a SIMS profile showing distribution of silicon (Si), fluorine (F) and oxygen ($O_2$) after deposition of a first oxide film, a blanket etch using $NF_3$ and deposition of a second oxide film according to the present invention, and FIG. 7B is a SIMS profile showing that fluorine (F) ions are not diffused into the interface of an insulating layer even after an annealing process according to the present invention.

According to the present invention described above, after a first oxide film is formed in a trench, an impurity remaining on the first oxide film in the process of etching the first oxide film using a gas containing fluorine is stripped by means of oxygen plasma or hydrogen plasma. Thus, it can prevent degradation of device properties due to diffusion of the impurity without additional equipment. Therefore, it can help improve reliability of a next-generation device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for forming an insulating layer in a semiconductor device, comprising the steps of:

etching a semiconductor substrate to a predetermined depth to form a trench;

forming a sidewall oxide film in the trench by means of an oxidization process and then forming a first oxide film on the entire structure, wherein the first oxide film fills the trench;

performing a first blanket etch process on the first oxide film, wherein an impurity remains on the first oxide film;

stripping the impurity by means of an impurity etch process; and forming a second oxide film on the entire structure and then performing a second blanket etch process to form an insulating layer.

2. The method as claimed in claim 1, comprising performing the first blanket etch process by applying a high frequency (HF) power of about 500 W to 1000 W and a low frequency (LF) power of about 3000 W to 4000 W.

3. The method as claimed in claim 1, comprising performing the impurity etch process by applying an HF power of 500 W to to 2000 W and an LF power of 1000 W to 8000 W.

4. The method as claimed in claim 1, wherein the impurity comprises fluorine (F).

5. The method as claimed in claim 1, comprising performing the first blanket etch process using a mixed gas of nitrogen trifluoride ($NF_3$) and helium (He).

6. The method as claimed in claim 5, wherein the flowrate of $NF_3$ is 50 sccm to 200 sccm and the flowrate of He is 200 sccm to 500 sccm.

7. The method as claimed in claim 1, comprising performing the impurity etch process using a mixed gas of oxygen ($O_2$) and He.

8. The method as claimed in claim 7, wherein the flowrate of $O_2$ is 100 sccm to 1000 sccm and the flowrate of He is 200 sccm to 500 sccm.

9. The method as claimed in claim 1, comprising performing the impurity etch process using a mixed gas of hydrogen ($H_2$) and He.

10. The method as claimed in claim 9, wherein the flowrate of $H_2$ is 100 sccm to 1000 sccm and the flowrate of He is 200 sccm to 500 sccm.

11. A method for forming an insulating layer in a semiconductor device, comprising the steps of:

sequentially forming a tunnel oxide film, a polysilicon film and a nitride film on a semiconductor substrate and then etching a given region of each of the films to expose the semiconductor substrate;

etching the exposed semiconductor substrate to a predetermined depth to form a trench;

forming a sidewall oxide film in the trench by means of an oxidization process and then forming a first oxide film on the entire structure;

performing a first blanket etch process on the first oxide film, wherein an impurity remains on the first oxide film;

stripping the impurity by means of an impurity etch process using oxygen or hydrogen plasma; and forming a second oxide film on the entire structure and then performing a second blanket etch process to form an insulating layer.

12. The method as claimed in claim 11, comprising performing the first blanket etch process so that the top surface of the first oxide film is located higher than the interface of the tunnel oxide film and the polysilicon film.

13. The method as claimed in claim 12, comprising performing the first blanket etch process by applying an HF power of about 500 W to 1000 W and an LF power of about 3000 W to 4000 W.

14. The method as claimed in claim 12, comprising performing the impurity etch process by applying an HF power of 500 W to 2000 W and an LF power of 1000 W to 6000 W.

15. The method as claimed in claim 12, comprising performing the first blanket etch process using a mixed gas of $NF_3$ and He.

16. The method as claimed in claim 15, wherein the flowrate of $NF_3$ is 50 sccm to 200 sccm and the flowrate of He is 200 sccm to 500 sccm.

17. The method as claimed in claim 12, comprising performing the impurity etch process using a mixed gas of $O_2$ and He.

18. The method as claimed in claim 17, wherein the flowrate of $O_2$ is 100 sccm to 1000 sccm and the flowrate of He is 200 sccm to 500 sccm.

* * * * *